(12) United States Patent
Cheng et al.

(10) Patent No.: US 9,659,963 B2
(45) Date of Patent: May 23, 2017

(54) CONTACT FORMATION TO 3D MONOLITHIC STACKED FINFETS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/753,908

(22) Filed: Jun. 29, 2015

(65) Prior Publication Data

US 2016/0380002 A1      Dec. 29, 2016

(51) Int. Cl.
*H01L 27/12* (2006.01)
*H01L 27/06* (2006.01)
(Continued)

(52) U.S. Cl.
CPC .... *H01L 27/1211* (2013.01); *H01L 21/30604* (2013.01); *H01L 21/845* (2013.01); *H01L 27/0688* (2013.01); *H01L 29/401* (2013.01)

(58) Field of Classification Search
CPC ..... H01L 21/823431; H01L 21/823821; H01L 21/845; H01L 27/0688; H01L 27/0886; H01L 27/0924; H01L 27/1211
See application file for complete search history.

(56) References Cited

U.S. PATENT DOCUMENTS 7,098,477 B2    8/2006  Zhu et al.
8,093,659 B2    1/2012  Nuttinck
(Continued)

FOREIGN PATENT DOCUMENTS

IE    WO 2014162018 A1 * 10/2014 ......... H01L 21/8258
WO    WO2014162018        10/2014

OTHER PUBLICATIONS

Chan et al., "Three-dimensional stacked-Fin-CMOS integrated circuit using double layer SOI material" Proc. IEEE 7th International Conference on Solid-State and Integrated Circuits Technology, Oct. 18-21, 2004, pp. 81-85, vol. 1.
(Continued)

*Primary Examiner* — Eduardo A Rodela
*Assistant Examiner* — Christopher M Roland
(74) *Attorney, Agent, or Firm* — Scully, Scott, Murphy & Presser, P.C.; Steven J. Meyers

(57) ABSTRACT

A first gate structure straddles one end of a staircase fin stack that contains a first semiconductor material fin, an insulator fin, and a second semiconductor material fin, a second gate structure straddles a portion of the staircase fin stack, a third gate structure straddles another end of the staircase fin stack, and a fourth gate structure straddles a portion of only the first semiconductor fin. A first contact structure is between the first and second gate structures, a second contact structure is between the second and third gate structures, and a third contact structure is between the third and fourth gate structures. The first contact structure has a contact metal that contacts the first and second semiconductor material fins. The second contact structure has a contact metal that contacts only the second semiconductor material fin, and the third contact structure has a contact metal that contacts only the first semiconductor fin.

20 Claims, 7 Drawing Sheets

(51) Int. Cl.
*H01L 21/84* (2006.01)
*H01L 21/306* (2006.01)
*H01L 29/40* (2006.01)

(56) References Cited

U.S. PATENT DOCUMENTS

| | | | |
|---|---|---|---|
| 8,779,495 | B2 | 7/2014 | Happ et al. |
| 9,472,558 | B1 * | 10/2016 | Cheng ................. H01L 27/1116 |
| 2006/0220134 | A1 | 10/2006 | Huo et al. |
| 2007/0181947 | A1 | 8/2007 | Ching Ho Chan et al. |
| 2011/0280076 | A1 * | 11/2011 | Samachisa ............. B82Y 10/00 |
| | | | 365/185.17 |
| 2015/0162404 | A1 * | 6/2015 | Yang ............... H01L 21/823431 |
| | | | 257/401 |
| 2016/0211276 | A1 * | 7/2016 | Liu ..................... H01L 27/1211 |
| 2016/0336421 | A1 * | 11/2016 | Cheng ................. H01L 27/0924 |

OTHER PUBLICATIONS

Wu et al., "A three-dimensional stacked fin-CMOS technology for high-density ULSI circuits", IEEE Trans Electron Devices 52: Sep. 2005, pp. 1998-2003, vol. 52, No. 9.
Batude et al., "Enabling 3D Monolithic Integration", ECS Transactions, May 15-18, 2011, 16 (8) pp. 47-54.

* cited by examiner

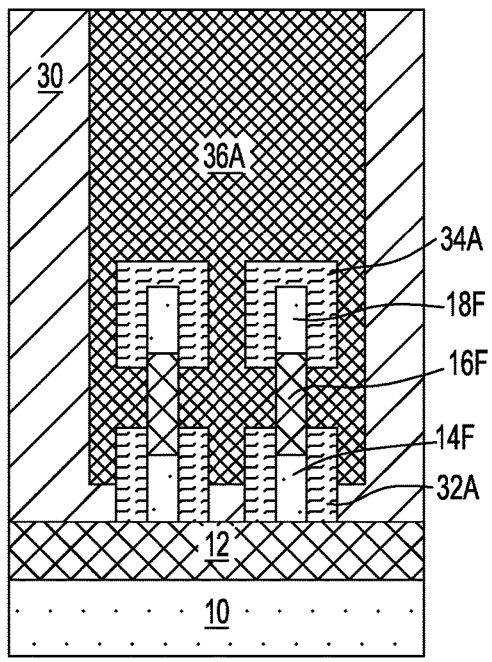
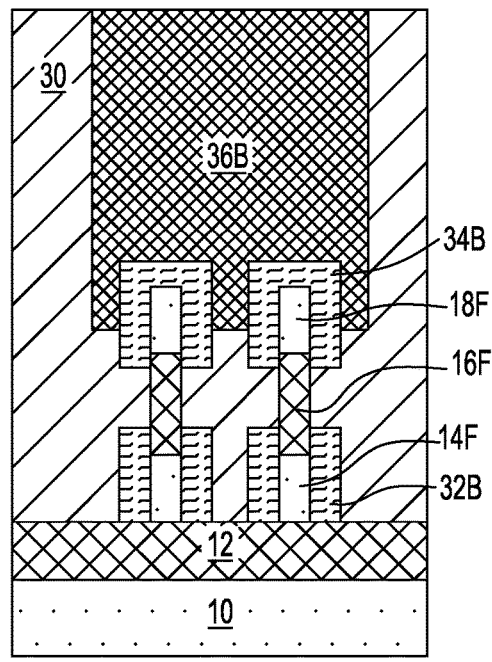
FIG. 4D    FIG. 4E
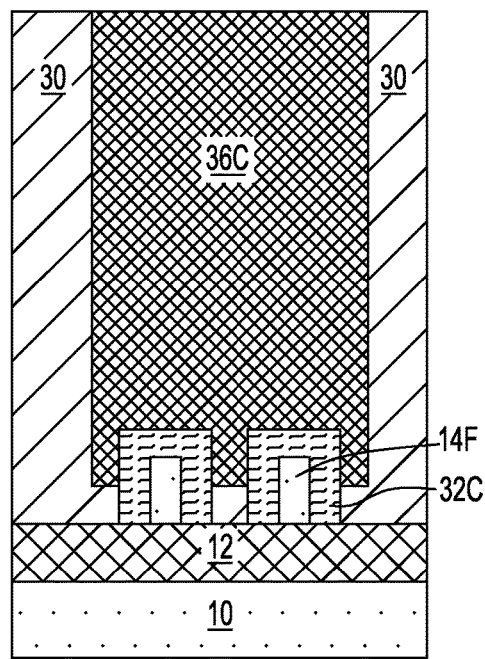
FIG. 4F

CONTACT FORMATION TO 3D MONOLITHIC STACKED FINFETS

BACKGROUND

The present application relates to a semiconductor structure and a method of forming the same. More particularly, the present application relates to a semiconductor structure including contact structures for contacting different tiers of a staircase fin stack containing vertically stacked transistors. The present application also relates to a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Three dimensional (3D) monolithic integration is touted as an alternative for continued CMOS density scaling. By utilizing stacked transistors, a significant area reduction can be achieved. Also, shorter interconnect routing can be achieved utilizing shorter vertical wiring rather than longer horizontal wiring. Despite the above advantages in 3D monolithic integration, there remains a challenge in forming contact structures to such 3D stacked transistors that avoid requiring a large space.

SUMMARY

In one aspect of the present application, a semiconductor structure is provided that includes contact structures for contacting different tiers of a staircase fin stack containing vertically stacked transistors which do not require a large space. In one embodiment of the present application, the semiconductor structure includes a staircase fin stack comprising, from bottom to top, a first semiconductor material fin, an insulator fin, and a second semiconductor material fin. The staircase fin stack extends upwards from a substrate. A first gate structure straddles over a first portion of the staircase fin stack, a second gate structure straddles over a second portion of the staircase fin stack, a third gate structure straddles over a third portion of the staircase fin stack, and a fourth gate structure straddles over an exposed portion of only the first semiconductor material fin. An interlevel dielectric material surrounds the first gate structure, the second gate structure, the third gate structure and the fourth gate structure. A first contact structure is located in a first portion of the interlevel dielectric material and between the first gate structure and the second gate structure, a second contact structure is located in a second portion of the interlevel dielectric material and between the second gate structure and the third gate structure, and a third contact structure is located in a third portion of the interlevel dielectric material and between the third gate structure and the fourth gate structure. In accordance with the present application, the first contact structure has a contact metal contacting the second semiconductor material fin and the first semiconductor material fin of the staircase fin stack, while the second contact structure has a contact metal that contacts only the second semiconductor material fin. Also, and in accordance with the present application, the third contact structure has a contact metal that contacts only the first semiconductor material fin.

In another aspect of the present application, a method of forming contact structures for contacting different tiers of a staircase fin stack containing vertically stacked transistors which do not require a large space is provided. In one embodiment of the present application, the method includes forming a staircase fin stack comprising, from bottom to top, a first semiconductor material fin, an insulator fin, and a second semiconductor material fin. The staircase fin stack extends upwards from a substrate. Next, a first gate structure is formed straddling over a first portion of the staircase fin stack, a second gate structure is formed straddling over a second portion of the staircase fin stack, a third gate structure is formed straddling over a third portion of the staircase fin stack, and a fourth gate structure is formed straddling over an exposed portion of only the first semiconductor material fin. An interlevel dielectric material is then formed surrounding the first gate structure, the second gate structure, the third gate structure and the fourth gate structure. Next, a first contact structure is formed in a first portion of the interlevel dielectric material and between the first gate structure and the second gate structure, a second contact structure is formed in a second portion of the interlevel dielectric material and between the second gate structure and the third gate structure, and a third contact structure is formed in a third portion of the interlevel dielectric material and between the third gate structure and the fourth gate structure. In accordance with the present application, the first contact structure has a contact metal contacting the second semiconductor material fin and the first semiconductor material fin of the staircase fin stack, while the second contact structure has a contact metal that contacts only the second semiconductor material fin. Also, and in accordance with the present application, the third contact structure has a contact metal that contacts only the first semiconductor material fin.

BRIEF DESCRIPTION OF SEVERAL VIEWS OF THE DRAWINGS

FIG. 4D is a cross sectional view of the exemplary semiconductor structure of FIG. 4A along vertical plane D-D'.

FIG. 4E is a cross sectional view of the exemplary semiconductor structure of FIG. 4A along vertical plane E-E'.

FIG. 4F is a cross sectional view of the exemplary semiconductor structure of FIG. 4A along vertical plane F-F'.

DETAILED DESCRIPTION

Figure 1:
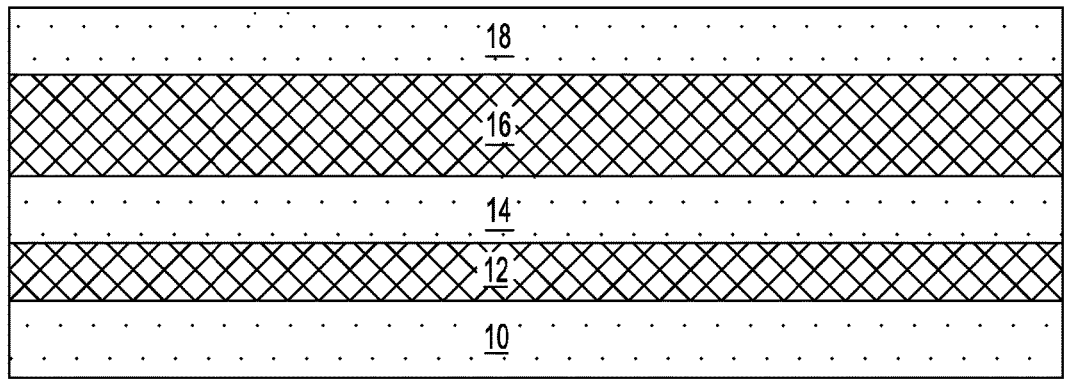
FIG. 1 is a cross sectional view of an exemplary semiconductor structure including, from bottom to top, a handle substrate, a first insulator layer, a first semiconductor material layer, a second insulator layer, and a second semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a handle substrate 10, a first insulator layer 12, a first semiconductor material layer 14, a second insulator layer 16, and a second semiconductor material layer 18 that can be employed in accordance with an embodiment of the present application. Collectively, the exemplary semiconductor structure as shown in FIG. 1 and including the handle substrate 10, the first insulator layer 12, the first semiconductor material layer 14, the second insulator layer 16, and the second semiconductor material layer 18 can be referred to herein as a double semiconductor-on-insulator (SOI) substrate.

In some embodiments of the present application, the handle substrate 10 of the double SOI substrate may comprise a semiconductor material. The term "semiconductor" as used herein in connection with the semiconductor material of the handle substrate 10 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 may be comprised of silicon. In some embodiments, the handle substrate 10 is a non-semiconductor material including, for example, a dielectric material and/or a conductive material.

The first insulator layer 12 of the exemplary semiconductor structure shown in FIG. 1 may be a crystalline or non-crystalline oxide and/or nitride. In one embodiment, the first insulator layer 12 is an oxide such as, for example, silicon dioxide. In another embodiment, the first insulator layer 12 is a nitride such as, for example, silicon nitride or boron nitride. In yet still another embodiment of the present application, the first insulator layer 12 may be a multilayered structure such as a stack of, in any order, silicon dioxide and boron nitride. The thickness of the first insulator layer 12 that may be used in the present application can be from 10 nm to 200 nm. Other thicknesses that are lesser than, or greater than, the aforementioned thickness range for the first insulator layer 12 can also be used in the present application.

The first semiconductor material layer 14 comprises a first semiconductor material that may comprise one of the semiconductor materials mentioned above for the handle substrate 10. In one embodiment, the first semiconductor material layer 14 comprises a same semiconductor material as the handle substrate 10. In another embodiment, the first semiconductor material layer 14 comprises a different semiconductor material than the handle substrate 10. In one embodiment, the first semiconductor material layer 14 comprises silicon. The thickness of the first semiconductor material layer 14 that can be used in the present application can be from 10 nm to 150 nm. Other thicknesses that are lesser than, or greater than, the aforementioned range can also be employed in the present application as the thickness of the first semiconductor material layer 14.

The second insulator layer 16 of the exemplary semiconductor structure shown in FIG. 1 may comprise one of the dielectric materials mentioned above for the first insulator layer 12. In one embodiment of the present application, the first and second insulator layers (12, 16) comprise a same material. In one example, the first and second insulator layers (12, 16) both comprise silicon dioxide or silicon nitride or boron nitride or any multilayered stack of such dielectric materials. In another embodiment of the present application, the second insulator layer 16 comprises a different dielectric material than the first insulator layer 12. The thickness of the second insulator layer 16 that may be used in the present application can be from 10 nm to 200 nm. Other thicknesses that are lesser than, or greater than, the aforementioned thickness range for the second insulator layer 16 can also be used in the present application. The thickness of the second insulator layer 16 can be equal to, less than or greater than the thickness of the first insulator layer 12.

The second semiconductor material layer 18 comprises a second semiconductor material that may comprise one of the semiconductor materials mentioned above for the handle substrate 10. In one embodiment, the second semiconductor material layer 18 comprises a same semiconductor material as the first semiconductor material layer 14. In one example, the first and second semiconductor material layers (14, 18) both comprise silicon or germanium or a silicon germanium alloy or a III-V compound semiconductor. In another embodiment, the second semiconductor material layer 18 comprises a different semiconductor material than the first semiconductor material layer 14. In one example, the first semiconductor material layer 14 comprises silicon, while the second semiconductor material layer 18 comprises germanium, a silicon germanium alloy or a III-V compound semiconductor. The thickness of the second semiconductor material layer 18 that can be used in the present application can be from 10 nm to 150 nm. Other thicknesses that are lesser than, or greater than, the aforementioned range can also be employed in the present application as the thickness of the second semiconductor material layer 18. The thickness of the second semiconductor material layer 18 may be equal to, less than, or greater than the thickness of the first semiconductor material layer 14.

In some embodiments, the handle substrate 10, the first semiconductor material layer 14 and/or the second semiconductor material layer 18 may have a same crystal orientation. In other embodiments, the handle substrate 10 and the first semiconductor material layer 14 or the handle substrate 10 and the second semiconductor material layer 18 may have different crystal orientations. In some embodiments, at least the first and second semiconductor material layers (14, 18) comprise a same crystallographic orientation. The crystal orientation of the handle substrate 10 and/or the first semiconductor material layer 14 and/or the second semiconductor material layer 18 may be {100}, {110}, or {111}. Other crystallographic orientations besides those specifically mentioned can also be used in the present application. The handle substrate 10 may be a single crystalline semiconductor material, a polycrystalline material, or an amorphous material. The first and the second semiconductor material layers (14, 18) are typically comprised of a single crystalline semiconductor material such as, for example, single crystalline silicon.

The exemplary semiconductor structure shown in FIG. 1 can be formed utilizing standard processes known in the art. In one example, a layer transfer process including wafer bonding may be used to provide the exemplary semiconductor structure shown in FIG. 1. In another embodiment, two different SIMOX (Separation by IMplantation of OXygen) may be used in providing the exemplary semiconductor structure shown in FIG. 1.

Figure 2A:
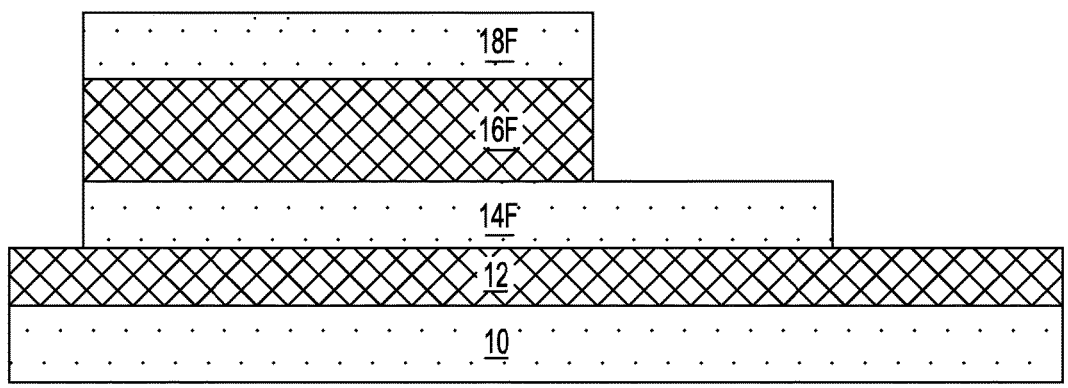
FIG. 2A is a cross sectional view of the exemplary semiconductor structure of FIG. 1 after forming a staircase fin stack of, from bottom to top, a remaining portion of the first semiconductor material layer (i.e., first semiconductor material fin), a remaining portion of the second insulator layer (i.e., insulator fin), and a remaining portion of the second semiconductor material (i.e., second semiconductor material fin).
Figure 2B:
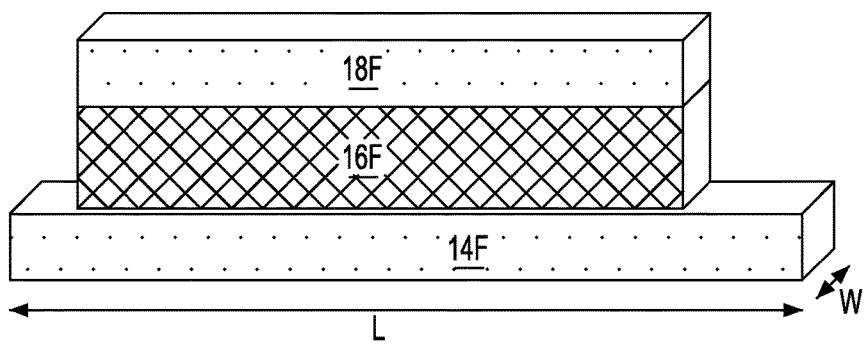
FIG. 2B is a three-dimensional illustration of the staircase fin stack shown in FIG. 2A.

Referring now to FIG. 2A, there is illustrated the exemplary semiconductor structure of FIG. 1 after forming a staircase fin stack (14F, 16F, 18F) of, from bottom to top, a remaining portion of the first semiconductor material layer 14 (i.e., first semiconductor material fin 14F), a remaining portion of the second insulator layer 16 (i.e., insulator fin 16F), and a remaining portion of the second semiconductor material 18 (i.e., second semiconductor material fin 18F). The staircase fin stack (14F, 16F 18F) extends upwards from a surface of substrate (i.e., insulator layer 12). FIG. 2B is a 3D illustration of the staircase fin stack (14F, 16F, 18F) shown in FIG. 2A. By "staircase fin stack" it is meant a fin stack in which the lower semiconductor fin has a length and width that is greater than a length and width of an upper semiconductor fin, and wherein an insulator fin typically having the same dimensions as the upper semiconductor fin is present between the lower and upper semiconductor fins.

The exemplary semiconductor structure shown in FIGS. 2A-2B can be formed by first patterning the second semiconductor material layer 18, the second insulator layer 16 and the first semiconductor material layer 14 of the exemplary semiconductor structure shown in FIG. 1 to provide a non-staircase fin stack (not shown) of, from bottom to top, a first semiconductor material portion, an insulator portion and a second semiconductor material portion. The term "non-staircase fin stack" denotes a material stack in which each layer of the material stack has a same width and a same length. Thus, the first semiconductor material portion, the insulator portion and the second semiconductor material portion of each non-staircase fin stack have a pair of sidewall surfaces that are vertically coincident to each other. The first semiconductor material portion that is formed during the patterning step is the first semiconductor material fin 14F of the subsequently formed staircase fin stack. Although a single non-staircase fin stack is described, a plurality of non-staircase fin stacks can be formed at this point of the present application.

In one embodiment of the present application, the patterning process comprises a sidewall image transfer (SIT) process. The SIT process includes forming a contiguous mandrel material layer (not shown) over the second semiconductor material layer 18. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the second semiconductor material layer 18, the second insulator layer 16 and the first semiconductor material layer 14 of the exemplary semiconductor structure shown in FIG. 1. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process that is used in providing the first semiconductor material portion, the insulator portion and the second semiconductor material portion of the non-staircase fin stack can include lithography and etching. Lithography includes forming a photoresist material (not shown) on a topmost surface of the second semiconductor material layer 18. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the second semiconductor material layer 18. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In any of the patterning processes mentioned above, a hard mask layer such as, for example, silicon dioxide and/or silicon nitride may be formed on the topmost surface of second semiconductor material layer 18 prior to patterning. After patterning, a remaining portion of the hard mask layer is present atop each topmost non-staircase fin stack. The portion of the hard mask layer that remains after patterning can be referred to herein as hard mask cap (not shown). The hard mask cap can be removed after patterning by a planarization process such as, for example, chemical mechanical planarization and/or grinding.

As mentioned previously, each non-staircase fin stack that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each non-staircase fin stack that is formed has a height from 10 nm to 100 nm, and a width from 5 nm to 30 nm. Other heights and widths that are lesser than, or greater than, the aforementioned ranges may also be used in the present application for each non-staircase fin stack. Each non-staircase fin stack is separated from its nearest neighboring non-staircase fin stack by a pitch that is from 20 nm to 60 nm; the pitch can be measured from a central portion of one non-staircase fin stack to a central portion of the nearest neighboring non-staircase fin stack.

After providing the non-staircase fin stack, a block mask (not shown) can be formed over a portion of the remaining portion of the second semiconductor material portion of the non-staircase fin stack. The block mask that can be used in the present application may include any material that can protect some areas of the non-staircase fin stack during processing of other preselected areas of the non-staircase fin stack. In one embodiment, the block mask may be composed of only a photoresist material. In another embodiment, the block mask may be composed of only a hard mask material. Examples of hard mask materials that can be used as a block mask include silicon dioxide, silicon nitride and/or silicon oxynitride. In another embodiment of the present application, the block mask may comprise a stack of, from bottom to top, a hard mask material and a photoresist material. The block mask can be formed utilizing techniques that are well known to those skilled in the art. For example, the block mask can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask.

Following the formation of the block mask atop portions of the non-staircase fin stack, at least one etch is then performed to remove portions of the second semiconductor material portion and portions of the insulator portion of the non-staircase fin stack to provide the second semiconductor material fin 18F and the insulator fin 16F of the staircase fin stack (14F, 16F, 18F) shown in FIGS. 2A-2B. The second semiconductor material fin 18F comprises a non-etched portion of the second semiconductor material portion, while the insulator fin 16F comprises a non-etched portion of the insulator portion. After forming the staircase fin stack (14F, 16F, 18F), the block mask can be removed utilizing any conventional material removal process.

The staircase fin stack (14F, 16F, 18F) includes the first semiconductor material fin 14F having a length, L, and width, W, that is greater than a length and width of each of the overlying insulator fin 16F and the second semiconductor material fin 18F. The insulator fin 16F has a same width and a same length as the overlying second semiconductor material fin 18F. As such, the insulator fin 16F and the second semiconductor material fin 18F have a pair of sidewall surfaces that are vertically coincident to each other. In the illustrated embodiment, the second semiconductor material fin 18F covers an entirety of the underlying topmost surface of the insulator fin 16F, while the insulator fin 16F is only present on a portion of the topmost surface of the first semiconductor material fin 14F. Thus, some portions of the topmost surface of the first semiconductor material fin 14F are exposed at this point of the present application.

In some embodiments (not shown), another block mask and another etch can be performed to the staircase fin stack (14F, 16F, 18F) shown in FIGS. 2A-2B to provide a second semiconductor material fin 18F whose width and/or length would be less than the width and/or length of the underlying insulator fin 16F. In such an embodiment, a portion of a topmost surface of the insulator fin 16F would be exposed.

Figure 3A:
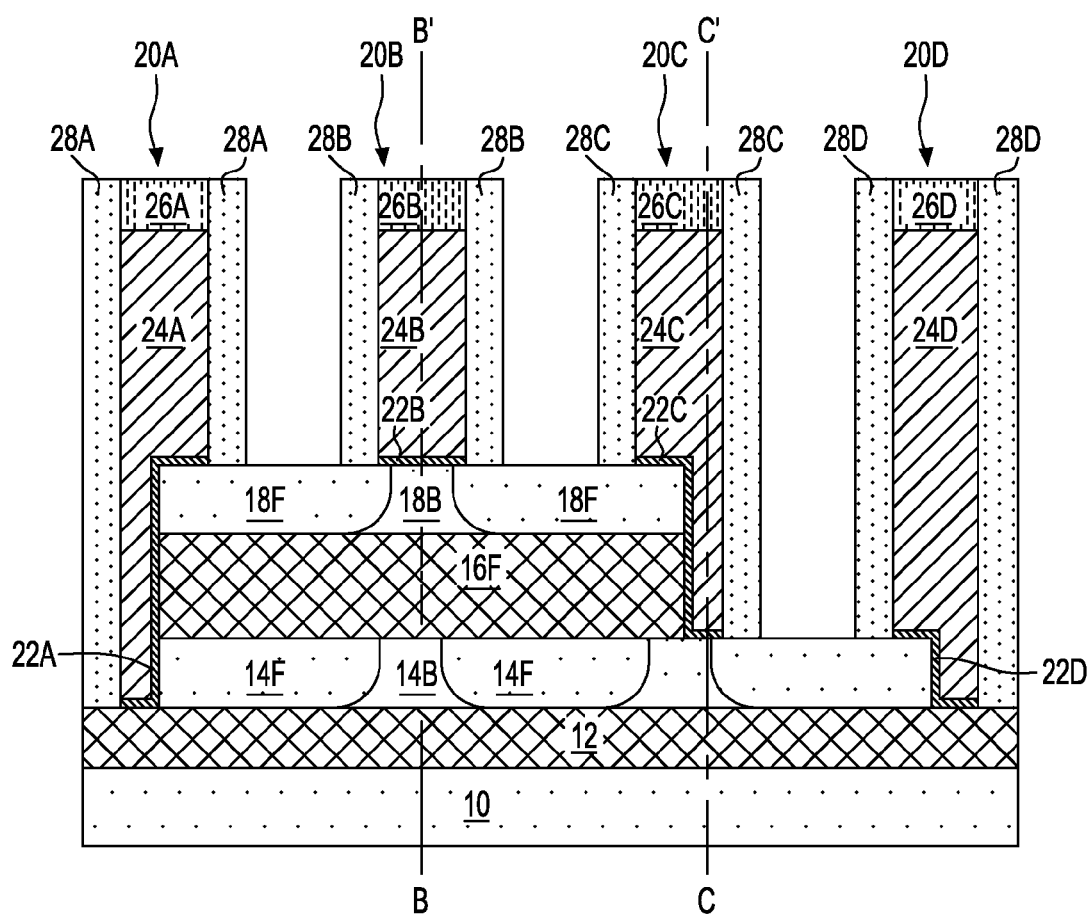
FIG. 3A is a cross sectional view of the exemplary semiconductor structure of FIG. 2A after forming a first gate structure, a second gate structure, a third gate structure and a fourth gate structure straddling over different portions of the staircase fin stack.
Figure 3B:
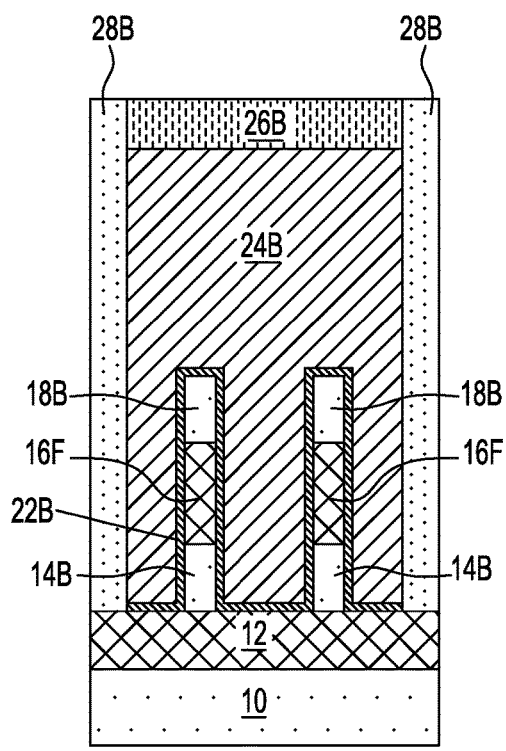
FIG. 3B is a cross sectional view of the exemplary semiconductor structure of FIG. 3A along vertical plane B-B'.
Figure 3C:
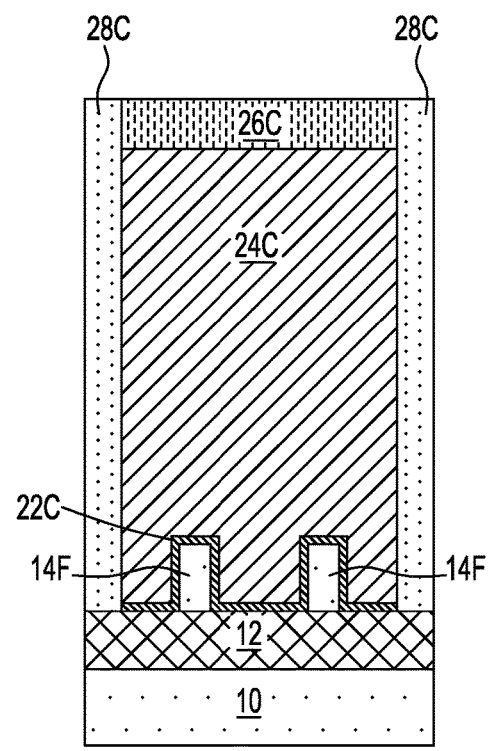
FIG. 3C is a cross sectional view of the exemplary semiconductor structure of FIG. 3A along vertical plane C-C'.

Referring now to FIGS. 3A-3C, there are illustrated various views of the exemplary semiconductor structure of FIG. 2A after forming a first gate structure 20A, a second gate structure 20B, a third gate structure 20C and a fourth gate structure 20D straddling over different portions of the staircase first stack (14F, 16F, 18F).

Each gate structure (i.e., 20A, 20B, 20C and 20D) that is formed includes a gate material stack of, from bottom to top, a gate dielectric portion (i.e., 22A, 22B, 22C and 22D) and a gate conductor portion (i.e., 24A, 24B, 24C and 24D). In some embodiments, a gate cap portion (i.e., 26A, 26B, 26C and 26D) can be present atop the gate conductor portion (i.e., 24A, 24B, 24C and 24D). Although a single first, second, third and fourth gate structure is described and illustrated, a plurality of gate structures straddling over different portions of each staircase fin stack may be formed.

The first gate structure 20A includes a first gate dielectric material portion 22A, a first gate conductor portion 24A and, an optional, first gate cap 26A. The second gate structure 20B includes a second gate dielectric material portion 22B, a second gate conductor portion 24B and, an optional, second gate cap 26B. The third gate structure 20C includes a third gate dielectric material portion 22C, a third gate conductor portion 24C and, an optional, third gate cap 26C. The fourth gate structure 20D includes a fourth gate dielectric material portion 22D, a fourth gate conductor portion 24D and, an optional, fourth gate cap 26D.

In accordance with the present application, the first gate structure 20A straddles over a first portion of the staircase fin stack (14F, 16F, 18F) which includes sidewall surfaces of the first semiconductor material fin 14F, the insulator fin 16F and the second semiconductor material fin 18F. The third gate structure 20C straddles over a third portion of the staircase fin stack (14F, 16F, 18F) which includes other sidewall surfaces of the insulator fin 16F and the second semiconductor material fin 18F. The second gate structure 20B straddles over a second portion of the staircase fin stack, which is located between the first portion of the staircase fin stack containing the first gate structure 20A and the third portion the staircase fin stack containing the third gate structure 20C. In accordance with the present application, the second gate structure 20B straddles over the second semiconductor material fin 18F, the insulator fin 16F and the first semiconductor material fin 14F. The fourth gate structure 20D straddles over an exposed portion of (i.e., a portion of the first semiconductor material fin 14F not covered by the insulator fin 16F and the second semiconductor material fin 18F) only the first material semiconductor fin 14F. By "straddle over" or "straddling over" it is meant that at least one portion of a gate structure is located on one side of a fin or fin stack, while another portion of the same gate structure is located on another side of the fin or fin stack. The two portions are interconnected by a portion of the gate structure that is located directly atop each fin or fin stack.

In accordance with the present application, a portion of the first gate structure 20A lands on a topmost surface of the second semiconductor material fin 18F and another portion of the first gate structure 20A lands on a portion of the first insulator layer 12. Also, and as is shown, a portion of the third gate structure 20C lands on a topmost surface of the second semiconductor material fin 18F and another portion of the third gate structure 20C lands on a portion of the first semiconductor material fin 14F.

Each gate dielectric portion (22A, 22B, 22C, 22D) comprises a gate dielectric material. The gate dielectric material that provides each gate dielectric portion (22A, 22B, 22C, 22D) can be an oxide, nitride, and/or oxynitride. In one example, the gate dielectric material that provides each gate dielectric portion (22A, 22B, 22C, 22D) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion (22A, 22B, 22C, 22D). In some embodiments, each gate dielectric portion (22A, 22B, 22C, 22D) comprises a same gate dielectric material. In other embodiments, at least one of the gate dielectric portions comprises a different gate dielectric material than at least one other gate dielectric portion.

The gate dielectric material used in providing each gate dielectric portion (22A, 22B, 22C, 22D) can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of the different gate structures, block mask technology can be used. In one embodiment of the present application, the gate dielectric material used in providing each gate dielectric portion (22A, 22B, 22C, 22D) can have a thickness in a range from 1 nm to 10 nm. Other thicknesses that are lesser than, or greater than, the aforementioned thickness range can also be employed for the gate dielectric material.

Each gate conductor portion (24A, 24B, 24C, 24D) comprises a gate conductor material. The gate conductor material used in providing each gate conductor portion (24A, 24B, 24C, 24D) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion (24A, 24B, 24C, 24D) comprises a same gate conductor material. In other embodiments, at least one of the gate conductor portions comprises a different gate conductor material than at least one other gate conductor portion. For example, at least one of the gate conductor portions may comprise an nFET gate metal, while at least one other of the gate conductor portions may comprise a pFET gate metal.

The gate conductor material used in providing each gate conductor portion (24A, 24B, 24C, 24D) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for at least one of gate conductor portions, block mask technology can be used. In one embodiment, the gate conductor material used in providing each gate conductor portion (24A, 24B, 24C, 24D) has a thickness from 1 nm to 100 nm. Other thicknesses that are lesser than, or greater than, the aforementioned thickness range can also be employed for the gate conductor material used in providing each gate conductor portion (24A, 24B, 24C, 24D).

If present, each gate cap portion (26A, 26B, 26C, 26D) comprises a gate cap material. The gate cap material that provides each gate cap portion (26A, 26B, 26C, 26D) may include one of the dielectric materials mentioned above for the hard mask layer. In one embodiment, each gate cap portion comprises silicon dioxide, silicon nitride, and/or silicon oxynitride. The dielectric material that provides each gate cap portion (26A, 26B, 26C, 26D) can be formed utilizing a conventional deposition process such as, for example, chemical vapor deposition or plasma enhanced chemical vapor deposition. The dielectric material that provides each gate cap portion can (26A, 26B, 26C, 26D) have a thickness from 5 nm to 20 nm. Other thicknesses that are lesser than, or greater than, the aforementioned thickness range can also be employed as the thickness of the dielectric material that provides each gate cap portion (26A, 26B, 26C, 26D).

The gate structures (20A, 20B, 20C, 20D) can be formed by providing a gate material stack of, from bottom to top, the gate dielectric material, the gate conductor material and, if present, the gate cap material. The gate material stack can then be patterned. In one embodiment of the present application, patterning of the gate material stack may be performed utilizing lithography and etching, as defined above.

After forming the gate structures (20A, 20B, 20C, 20D), source/drain regions can be formed by introducing an n-type dopant or a p-type dopant into exposed portions of each first and second semiconductor material fin (14F, 18F) not covered by the gate structure. The term "p-type" refers to the addition of impurities to an intrinsic semiconductor that creates deficiencies of valence electrons. In a silicon-containing semiconductor material fin, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor fin, examples of n-type dopants, i.e., impurities, include, but are not limited to, antimony, arsenic and phosphorous. The doping may be achieved utilizing ion implantation or gas phase doping. The source/drain regions would lie laterally adjacent to a body portion of each semiconductor fin.

In FIGS. 3A-3C, element 18B represents a body portion of the second semiconductor material fin 18F and of the second gate structure 20B, while element 14B represents a body portion of the first semiconductor material fin 14F and also of the second gate structure 20B. In accordance with the present application, the second gate structure 20B is a functional gate structure. First and fourth gate structures 20A and 20D act as dummy gates and are not electrically active. As is shown, the first and second gate structures (20A, 20B) share a common source/drain region of both the first and second semiconductor material fins (14F, 18F) and the second and third gate structures (20B, 20C) share a common source/drain region of both the first and second semiconductor material fins (14F, 18F). The third and fourth gate structures (20C, 20D) share a common source/drain region of the first semiconductor material fin 14F at this point of the present application.

In one embodiment, an upper portion of the second gate structure 20B that straddles the second semiconductor material fin 18F is a first pFET, while a lower portion of the second gate structure 20B that straddles the first semiconductor material fin 14F is a first nFET. In such an embodiment, the third gate structure 20C that contacts second semiconductor material fin 18F is an nFET, the first gate structure 20A is a second pFET and the fourth gate structure 20D is a second nFET. In some embodiments, the first gate structure 20A and the fourth gate structure 20D serve the purpose of tucking fins under the gate to improve the source/drain epitaxy quality.

In some embodiments, and prior to formation of the source/drain regions, a gate spacer (28A, 28B, 28C, 28D) can be formed on exposed sidewalls of the gate structure (20A, 20B, 20C, 20D). Element 28A represents a first gate spacer for the first gate structure 20A, element 28B represents a second gate spacer for the second gate structure 20B, element 28C represents a third gate spacer for the third gate structure 20C, and element 28D represents a fourth gate spacer for the fourth gate structure 20D. Each gate spacer (28A, 28B, 28C and 28D) can be formed by deposition of a gate spacer material, such as, for example, a dielectric oxide and/or a dielectric nitride, and then etching the deposited gate spacer material by utilizing a spacer etch.

Referring now to FIGS. 4A-4F, there are illustrated the exemplary semiconductor of FIGS. 3A-3C after forming a first contact structure (32A, 34A and 36A) contacting a first portion of the staircase fin stack (14F, 16F, 18F), a second contact structure (32B, 34B, 36B) contacting a second portion of the staircase fin stack (14F, 16F, 18F), and a third contact structure (32C, 36C) contacting a third portion of the staircase fin stack (14F, 16F, 18F). First contact structure (32A, 34A and 36A) is formed in a first portion of an interlevel dielectric (ILD) material 30 and between the first and second gate structures (20A, 20B), second contact structure (32B, 34B, 36B) is located in a second portion of the ILD material 30 and between the second and third gate structures (20B, 20C), and third contact structure (32C, 36C) is located in a third portion of the ILD material 30 and between the third and fourth gate structures (20C, 20D).

Prior to forming the various contact structures, the interlevel dielectric (ILD) material 30 is formed surrounding (i.e., atop and laterally adjacent) each gate structure (20A, 20B, 20C, 20D). The ILD material 30 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material 30. The use of a self-planarizing dielectric material as the ILD material 30 may avoid the need to perform a subsequent planarizing step.

In one embodiment, the ILD material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 30, a planarization process (such as, for example, chemical mechanical planarization or grinding) or an etch back process follows the deposition of the ILD material 30. The thickness of the ILD material 30 that can be employed in the present application may vary depending on the type of dielectric material employed as well as the method that was employed in forming the same. In one embodiment, the ILD material 30 has a thickness from 80 nm to 500 nm. Other thicknesses that are greater or lesser than the range provided above can also be used for the ILD material 30.

After providing the ILD material 30, deep and shallow contact openings (not shown) are formed in the ILD material 30 by lithography and etching. Each deep contact opening that is formed extends from the topmost surface of the ILD material 30 to an exposed topmost surface of the first semiconductor material fin 14F, while each shallow contact opening that is formed extends from the topmost surface of the ILD material 30 to a topmost surface of the second semiconductor material fin 18F. After forming the deep and shallow contact openings, an epitaxial semiconductor material is formed within each of the various openings. The epitaxial semiconductor material that is formed within each deep contact opening can be referred to herein as a lower epitaxial semiconductor material (32A, 32B, 34C), while the epitaxial semiconductor material that is formed within each shallow contact opening can be referred to herein as an upper epitaxial semiconductor material (34A, 34B). The upper and lower epitaxial semiconductor materials typically comprise a same semiconductor material. The semiconductor material that provides the lower epitaxial semiconductor material (32A, 32B, 32C) may be the same or different from the first semiconductor material fin 14F, while the semiconductor material that provides the upper epitaxial semiconductor material (34A, 34B) may be the same or different from the second semiconductor material fin 18F. In addition to including a semiconductor material and in some embodiments, each lower and upper semiconductor material may also include an n-type or p-type dopant.

The upper and lower epitaxial semiconductor materials are formed utilizing an epitaxial growth or epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. As such, each upper epitaxial semiconductor material (34A, 34B) has an epitaxial relationship, i.e., same crystal orientation, as that of the exposed surfaces of the second semiconductor material fin 18F. Each lower epitaxial semiconductor material (32A, 32B and 32C) has an epitaxial relationship with the exposed surfaces of the first semiconductor material fin 14F.

Examples of various epitaxial growth processes that are suitable for use in forming each lower and each upper epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well known semiconductor precursor source gases may be used for the deposition of the each lower and each upper epitaxial semiconductor material. Carrier gases like hydrogen, nitrogen, helium and argon can be used.

A dopant can be introduced during the epitaxial deposition process or after the epitaxial deposition of an intrinsic semiconductor material by ion implantation and gas phase doping. In some embodiments, a recess etch is performed after the epitaxial deposition process. Each lower and each upper epitaxial semiconductor material may have a thickness from 5 nm to 20 nm. Other thicknesses that are greater than, or lesser than, the aforementioned thickness range may also be employed in the present application.

Following the formation of each lower and each upper epitaxial semiconductor material, a contact metal (36A, 36B, 36C) is formed into selected deep and shallow contact openings and directly atop selected epitaxial semiconductor materials. The contact metal (36A, 36B, 36C) may include any metal that can serve as an electrical contact. Examples of metals that can be used as the contact metal (36A, 36B, 36C) include, but are not limited to, copper, aluminum, tungsten and alloys thereof. The metal that can be used as the contact metal (36A, 36B, 36C) can be deposited utilizing any well known deposition process such as, for example, chemical vapor deposition, plasma enhanced chemical vapor deposition, or plating. A planarization process may follow the deposition of the metal so as to provide the planar structure shown in FIG. 4A in which each contact metal (36A, 36B, 36C) has a topmost surface that is coplanar with the ILD material 30.

The first contact structure (32A, 34A, 36A) wraps around the staircase fin stack and thus has one portion of the contact metal 36A that contacts a topmost surface of the second semiconductor material fin 18F, and a second portion of the contact metal 36A that contacts a topmost surface of the first semiconductor material fin 16F. The contact metal 36B of the second contact (32B, 34B, 36B) only contacts a topmost surface of the second semiconductor material fin 18F, while the metal contact 36C of the third contact structure (32C, 36C) contacts only the topmost surface of the first semiconductor material fin 14F.

Figure 4A:
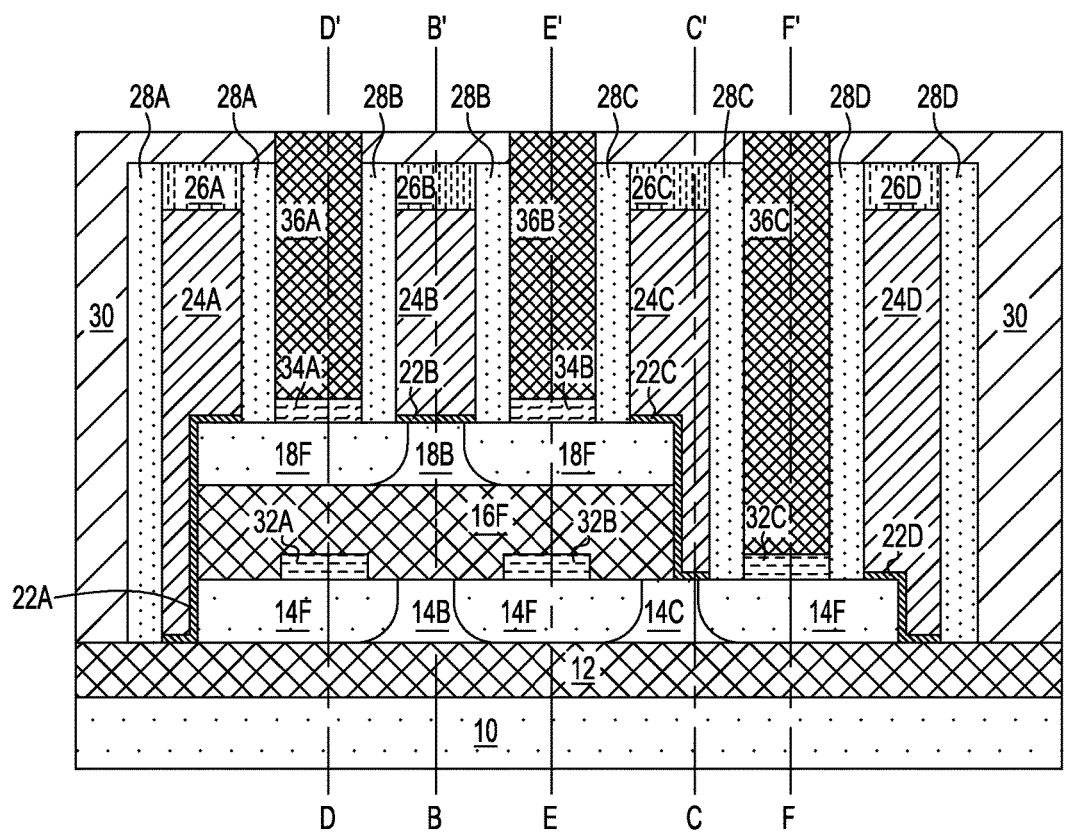
FIG. 4A is a cross sectional view of the exemplary semiconductor of FIGS. 3A-3C after forming a first contact structure contacting a first portion of the staircase fin stack, a second contact structure contacting a second portion of the staircase fin stack and a third contact structure contacting a third portion of the staircase fin stack.
Figure 4B:
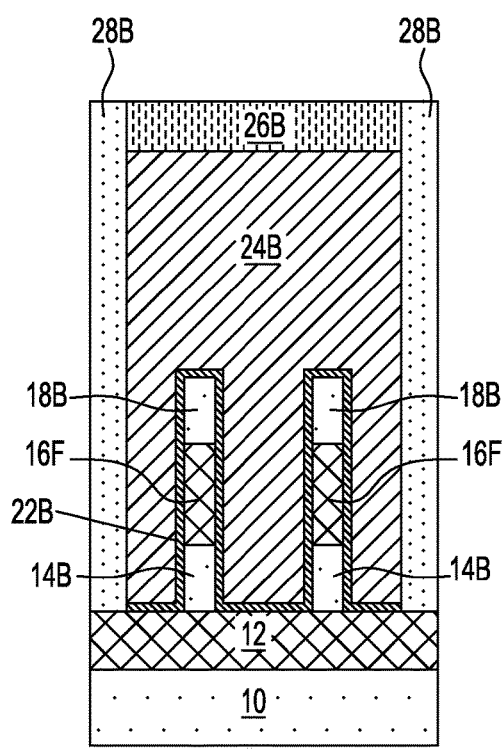
FIG. 4B is a cross sectional view of the exemplary semiconductor structure of FIG. 4A along vertical plane B-B'.
Figure 4C:
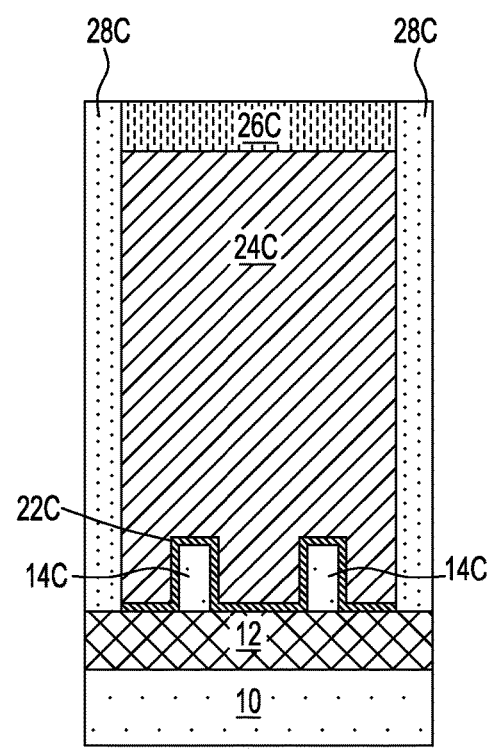
FIG. 4C is a cross sectional view of the exemplary semiconductor structure of FIG. 4A along vertical plane C-C'.

As shown in FIG. 4A, the third gate structure 20C can be biased to a voltage so that channel region 14C is 'on' to enable an electrical connection between the third contact structure (32C, 36C) to a region of the first semiconductor material fin 14F that is underneath contact metal 36B. In the present application, the third contact structure (32C, 36C), which is physically at a fin end and is easy to access, can serve as the electrical contact to a region of the first semiconductor material fin 14F underneath contact metal 36B (14F in this region is a source/drain terminal of the functional FET (gate conductor portion 24B, channel 14B)). In FIG. 4A, and during basing, the channel region 14C under the gate conductor portion 24C of the third gate structure 20C is "on" an electrical connection is formed between the third contact structure (32C, 36C) to the region 14F underneath contact metal 36B.

Figure 5:
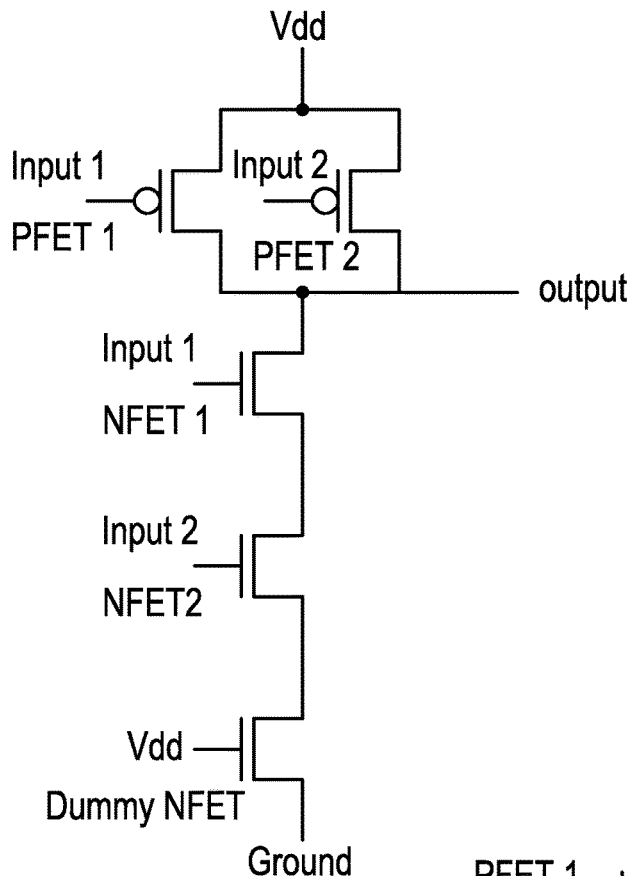
FIG. 5 is a NAND circuit diagram of the exemplary semiconductor structure of the present application.
Figure 6:
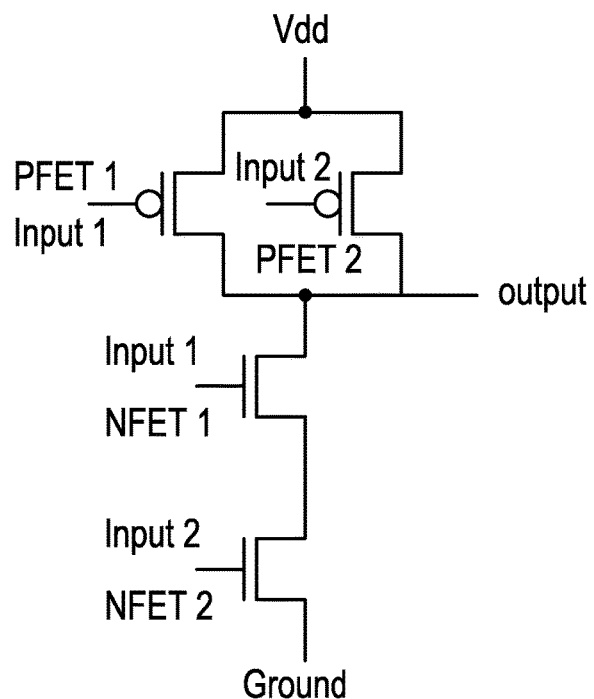
FIG. 6 is a circuit diagram of a prior art structure.

Referring now to FIG. 5, there is illustrated an NAND circuit diagram with two input terminal (input1 and input2) of the exemplary semiconductor structure of the present application. Notably, in FIG. 5, PFET 1 and PFET 2 represents two identical PFET transistors in parallel, each PFET corresponding to the PFET of the second gate structure 20B shown in FIG. 4A. Notably, in FIG. 5, NFET 1 and NFET 2 represents two identical NFET transistors in series, each NFET corresponding to the NFET of the second gate structure 20B shown in FIG. 4A. The dummy NFET in FIG. 5 is also in series with NFET 1 and NFET 2. The dummy NFET in FIG. 5 corresponds to the dummy NFET in FIG. 4A, i.e., the third gate structure 20 including the third gate conductor portion 24C. The source/drain terminal 14F on the right of the third gate conductor portion 24C is grounded through the third contact structure (32C, 36C). When the third gate conductor portion 24C is biased to a voltage to turn on the channel region 14C, an electrical connection is formed through the third contact structure (32C, 36C) to the source/drain terminal 14F on the right of the third gate conductor portion 24C, the channel region 14C, and the source/drain terminal 14F on the left of the third gate conductor portion 24C (this source/drain terminal is also the source/drain terminal of the functional NFET with the second gate conductor portion 24B). FIG. 6 is a circuit diagram of a prior art structure in which no dummy gate structure is present.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a staircase fin stack extending upwards from a substrate and comprising, from bottom to top, a first semiconductor material fin, an insulator fin, and a second semiconductor material fin;
    a first gate structure straddling over a first portion of said staircase fin stack, a second gate structure straddling over a second portion of said staircase fin stack, a third gate structure straddling over a third portion of said staircase fin stack, and a fourth gate structure straddling over an exposed portion of only said first semiconductor material fin;
    an interlevel dielectric material surrounding said first gate structure, said second gate structure, said third gate structure and said fourth gate structure; and
    a first contact structure located in a first portion of said interlevel dielectric material and between said first gate structure and said second gate structure, a second contact structure located in a second portion of said interlevel dielectric material and between said second gate structure and said third gate structure, and a third contact structure located in a third portion of said interlevel dielectric material and between said third gate structure and said fourth gate structure, wherein said first contact structure has a contact metal contacting said second semiconductor material fin and said first semiconductor material fin of said staircase fin stack, said second contact structure has a contact metal that contacts only said second semiconductor material fin, and said third contact structure has a contact metal that contacts only said first semiconductor material fin.

2. The semiconductor structure of claim 1, wherein said substrate comprising an insulator layer located directly beneath said first semiconductor material fin, and a handle substrate located directly beneath said insulator layer.

3. The semiconductor structure of claim 1, wherein said first contact structure further comprises an upper epitaxial semiconductor material located between a first portion of said metal contact and said second semiconductor material fin and a lower epitaxial semiconductor material located between a second portion of said metal contact and said first semiconductor material fin.

4. The semiconductor structure of claim 3, wherein said second contact structure further comprises an upper epitaxial semiconductor material located between said metal contact and said second semiconductor material fin and a lower epitaxial semiconductor material located on said first semiconductor material fin.

5. The semiconductor structure of claim 4, wherein said third contact structure further comprises a lower epitaxial semiconductor material located between said contact metal and said first semiconductor material fin.

6. The semiconductor structure of claim 1, wherein a topmost surface of said interlevel dielectric material is coplanar with a topmost surface of each of said first contact structure, said second contact structure, and said third contact structure.

7. The semiconductor structure of claim 1, wherein a gate dielectric spacer is located on sidewall surfaces of said first gate structure, said second gate structure, said third gate structure, and said fourth gate structure.

8. The semiconductor structure of claim 1, wherein said first semiconductor material fin has a length and a width that is greater than a length and a width of both said insulator fin and said second semiconductor material fin.

9. The semiconductor structure of claim 1, wherein a portion of said first gate structure lands on a topmost surface of said second semiconductor material fin and another portion of said first gate structure lands on a portion of said substrate.

10. The semiconductor structure of claim 9, wherein a portion of said third gate structure lands on a topmost surface of said second semiconductor material fin and another portion of said third gate structure lands on a portion of said first semiconductor material fin.

11. A method of forming a semiconductor structure, said method comprising:
    forming a staircase fin stack extending upwards from a substrate and comprising, from bottom to top, a first semiconductor material fin, an insulator fin, and a second semiconductor material fin;
    forming, in any order, a first gate structure straddling over a first portion of said staircase fin stack, a second gate structure straddling over a second portion of said staircase fin stack, a third gate structure straddling over a third portion of said staircase fin stack, and a fourth gate structure straddling over an exposed portion of only said first semiconductor material fin;
    forming an interlevel dielectric material surrounding said first gate structure, said second gate structure, said third gate structure and said fourth gate structure; and
    forming, in any order, a first contact structure in a first portion of said interlevel dielectric material and between said first gate structure and said second gate structure, a second contact structure in a second portion of said interlevel dielectric material and between said second gate structure and said third gate structure, and a third contact structure in a third portion of said interlevel dielectric material and between said third gate structure and said fourth gate structure, wherein said first contact structure has a contact metal contacting said second semiconductor material fin and said first semiconductor material fin of said staircase fin stack, said a second contact structure has a contact metal that contacts only said second semiconductor material fin and said third contact structure has a contact metal that contacts only said first semiconductor material fin.

12. The method of claim 11, wherein said forming said staircase fin stack comprises:
    providing a structure comprising, from bottom to top, a handle substrate, a first insulator layer, a first semiconductor material layer, a second insulator layer, and a second semiconductor material layer;
    patterning said second semiconductor material layer, said second insulator layer and said first semiconductor material layer to provide a non-staircase fin stack of, from bottom to top, a remaining portion of said first semiconductor material layer, a remaining portion of said second insulator layer and a remaining portion of said second semiconductor material layer; and
    etching a portion of said remaining portion of said second semiconductor material layer to provide said second semiconductor material fin and a portion of said remaining portion of said second insulator to provide said insulator fin, and wherein said remaining portion of said first semiconductor material provides said first semiconductor material fin.

13. The method of claim 12, wherein said patterning comprises a sidewall image transfer process.

14. The method of claim 11, further comprising forming a gate dielectric spacer on each sidewall surface of said first gate structure, said second gate structure, said third gate structure and said fourth gate structure prior to forming said interlevel dielectric material.

15. The method of claim 11, wherein said forming said first contact structure further comprises forming an upper epitaxial semiconductor material between a first portion of said metal contact and said second semiconductor material fin and forming a lower epitaxial semiconductor material between a second portion of said metal contact and said first semiconductor material fin.

16. The method of claim 15, wherein said forming said second contact structure further comprises forming an upper epitaxial semiconductor material between said metal contact and said second semiconductor material fin and forming a lower epitaxial semiconductor material on said first semiconductor material fin.

17. The method of claim 16, wherein said forming said third contact structure further comprises forming a lower epitaxial semiconductor material between said metal contact and said first semiconductor material fin.

18. The method of claim 11, wherein said third gate structure is biased to a voltage so that said third gate structure is on to enable contact to said fourth gate structure.

19. The method of claim 11, wherein a portion of said first gate structure lands on a topmost surface of said second semiconductor material fin and another portion of said first gate structure lands on a portion of said substrate.

20. The method of claim 11, wherein a portion of said third gate structure lands on a topmost surface of said second semiconductor material fin and another portion of said third gate structure lands on a portion of said first semiconductor material fin.

* * * * *